United States Patent
Shinotou et al.

(10) Patent No.: US 7,633,751 B2
(45) Date of Patent: Dec. 15, 2009

(54) ELECTRONIC APPARATUS

(75) Inventors: Kouichi Shinotou, Kawasaki (JP); Hideyuki Fujikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 306 days.

(21) Appl. No.: 11/359,594

(22) Filed: Feb. 23, 2006

(65) Prior Publication Data
US 2007/0081307 A1  Apr. 12, 2007

(30) Foreign Application Priority Data
Oct. 7, 2005  (JP) ............................. 2005-294609

(51) Int. Cl.
*H05K 7/20* (2006.01)
(52) U.S. Cl. .............................. 361/679.5; 361/679.48; 361/695; 349/58; 62/259.2; 454/184
(58) Field of Classification Search ................ 361/687, 361/695, 679.21, 679.48, 679.5, 679.53; 62/259.2; 165/104.33, 80.3, 122; 312/236; 349/58; 174/15.1, 16.1; 454/184
See application file for complete search history.

(56) References Cited

U.S. PATENT DOCUMENTS

| | | | |
|---|---|---|---|
| 5,457,602 A | | 10/1995 | Kimura et al. |
| 5,813,243 A | * | 9/1998 | Johnson et al. ............. 62/259.2 |
| 5,876,278 A | * | 3/1999 | Cheng ......................... 454/184 |
| 6,034,870 A | * | 3/2000 | Osborn et al. ................ 361/690 |
| 6,104,451 A | * | 8/2000 | Matsuoka et al. ............. 349/58 |
| 6,181,555 B1 | * | 1/2001 | Haley et al. .................. 361/687 |
| 6,188,573 B1 | | 2/2001 | Urita ........................... 361/687 |
| 6,324,056 B1 | * | 11/2001 | Breier et al. ................. 361/687 |
| 6,459,577 B1 | * | 10/2002 | Holmes et al. ............... 361/690 |
| 6,654,242 B2 | | 11/2003 | Ogawa ........................ 361/687 |
| 6,717,808 B2 | * | 4/2004 | Ueda et al. ................... 361/695 |
| 6,724,624 B1 | * | 4/2004 | Dodson ....................... 361/695 |
| 6,798,655 B2 | * | 9/2004 | Nagashima et al. ......... 361/687 |
| 7,104,081 B2 | * | 9/2006 | Chu et al. ................... 62/259.2 |
| 7,120,017 B2 | * | 10/2006 | Shieh .......................... 361/695 |

(Continued)

FOREIGN PATENT DOCUMENTS

CN           1249469 A       4/2000

(Continued)

OTHER PUBLICATIONS

First Notification of Office Action dated Dec. 7, 2007 in corresponding Chinese Patent Application No. 200610057427.0 (15 pages, including translation).

(Continued)

*Primary Examiner*—Jayprakash N Gandhi
*Assistant Examiner*—Courtney Smith
(74) *Attorney, Agent, or Firm*—Staas & Halsey LLP

(57) ABSTRACT

A personal computer (electronic apparatus) (1) is equipped with a plurality of heat generating devices: a power source unit (11), a CPU (12), an FD drive device (13), a CD/DVD drive device (14), and an LCD (15), and a cooling fan (16) for cooling the plurality of heat generating devices (11) through (15). The plurality of heat generating devices (11) through (15) are arranged in parallel in a direction Y which crosses a central axis (16*c*) of an impeller (16*b*) of the cooling fan (16). Further, the heat generating devices (11) through (15) are arranged within a blowing range (21) of the cooling fan (16).

4 Claims, 6 Drawing Sheets

U.S. PATENT DOCUMENTS

| | | | |
|---|---|---|---|
| 7,280,353 B2 * | 10/2007 | Wendel et al. | 361/685 |
| 7,298,615 B2 * | 11/2007 | Wong | 361/687 |
| 7,301,767 B2 * | 11/2007 | Takenoshita et al. | 361/695 |
| 7,312,988 B2 | 12/2007 | Maeda | |
| 7,349,205 B2 * | 3/2008 | Hall et al. | 361/685 |
| 2002/0075642 A1 * | 6/2002 | Nagashima et al. | 361/687 |
| 2003/0048598 A1 * | 3/2003 | Lee et al. | 361/681 |
| 2003/0090864 A1 * | 5/2003 | Kuo | 361/683 |
| 2004/0036819 A1 * | 2/2004 | Ryu et al. | 349/58 |
| 2004/0174675 A1 * | 9/2004 | Liu | 361/687 |
| 2005/0018399 A1 | 1/2005 | Shimizu | |
| 2005/0105012 A1 * | 5/2005 | Kim et al. | 349/58 |
| 2005/0117292 A1 * | 6/2005 | DiFonzo et al. | 361/687 |
| 2006/0158073 A1 | 7/2006 | Maeda | |

FOREIGN PATENT DOCUMENTS

| | | |
|---|---|---|
| JP | 61-51997 | 3/1986 |
| JP | 62-147397 | 9/1987 |
| JP | 01-200093 | 8/1989 |
| JP | 03-204017 | 9/1991 |
| JP | 06-013776 | 1/1994 |
| JP | 09-146660 | 6/1997 |
| JP | 11-154036 | 6/1999 |
| JP | 2003-017881 | 1/2003 |
| JP | 2003-345460 | 12/2003 |
| JP | 2004-203013 | 7/2004 |
| JP | 2005-005349 | 1/2005 |
| JP | 2005-084354 | 3/2005 |
| WO | WO 02/39298 | 5/2002 |
| WO | 2005/029299 | 3/2005 |

OTHER PUBLICATIONS

Japanese Notice of Reason for Rejection mailed Sep. 15, 2009 corresponding Japanese Patent Application 2005-294609 (3 pages and 4 pages of English translation).

* cited by examiner

ELECTRONIC APPARATUS

BACKGROUND OF THE INVENTION

1. Field of the Invention

The present invention relates to an electronic apparatus, such as a computer, which has a plurality of heat generating devices.

2. Description of the Related Technology

A personal computer is generally equipped with a power source unit, a CPU (central processing unit), an FD (flexible disk) drive device, and a CD (compact disc) drive device. Some personal computers are integrally provided with an LCD (liquid crystal display).

The power source unit, the CPU, the drive devices, and the LCD generate a relatively large amount of heat. In particular, the power source unit and the CPU generate a large amount of heat. The CPU is vulnerable to heat, so that it is necessary to cool the CPU and the heat generating devices around it.

As shown in FIG. 6, in a conventional personal computer 50, it is common practice to cool a CPU 51 by a heat sink 52 and, at the same time, to cool heat generating devices, such as a power source unit 53, the CPU 51, a CD/HDD drive device 54, an FD drive device 55, and an LCD 56, by a plurality of cooling fans, such as a system cooling fan 57a, a CPU cooling fan 57b, and a power source cooling fan 57c. In FIG. 6, reference numeral 58 indicates a main substrate, and reference numeral 59 indicates a casing.

[Patent Document 1] JP 01-200093 A
[Patent Document 2] JP 2005-5349 A
[Patent Document 3] JP 2004-203013 A
[Patent Document 4] Japanese Utility Model Application Laid-open No. Sho 62-147397
[Patent Document 5] JP 11-154036 A

SUMMARY OF THE INVENTION

However, the conventional personal computer 50, in which the heat generating devices 51 through 56 are cooled by using a plurality of cooling fans 57a, 57b, and 57c, involves a large number of devices, resulting in a rather large size.

Further, the plurality of cooling fans 57a, 57b, and 57c send airflows in different directions, so these airflows collide with each other within the casing 59 of the personal computer 50. As a result, the airflows are changed in direction, or reduced in pressure, so there is a fear of the heat generating devices 51 through 56 not being cooled efficiently.

In this case, it is necessary to keep the airflows from the cooling fans 57a, 57b, and 57c in balance, which involves a bothersome control. Further, the sounds from the plurality of cooling fans 57a, 57b, and 57c are combined to thereby generate a relatively large noise.

Further, when large cooling fans are installed, the portions where such large cooling fans are installed protrude from the remaining portion of the apparatus, resulting in a rather unbalanced outward appearance.

These problems are involved not only in personal computers but also in other electronic apparatuses in which a plurality of heat generating devices are cooled by cooling fans.

The present invention has been made with a view toward solving the above problems. It is a technical object of the present invention to provide an electronic apparatus capable of cooling a plurality of heat generating devices by a single cooling fan, thereby making it possible to achieve a reduction in the number of parts, a reduction in size, and an improvement in cooling efficiency, and to suppress noise generation.

To achieve the above technical object, the present invention provides an electronic apparatus which is equipped with a plurality of heat generating devices and which is constructed as follows.

(1) The present invention provides an electronic apparatus, including: a plurality of heat generating devices; and a cooling device for cooling the plurality of heat generating devices, wherein the plurality of heat generating devices are arranged in parallel in a direction crossing a central axis of an impeller of the cooling device; and the plurality of heat generating devices are arranged within a blowing range of the cooling device.

According to the present invention, a plurality of heat generating devices are arranged in parallel in a direction crossing the central axis of the impeller of the cooling device, so the airflow from the cooling device directly hits the plurality of heat generating devices. Thus, a plurality of heat generating devices can be cooled by a single cooling device, thereby making it possible to achieve a reduction in the number of parts, an improvement in cooling efficiency, and a reduction in size, and to suppress noise generation.

(2) Example of the heat generating devices comprise a power source unit and a CPU. The power source unit and the CPU, which generate a relatively large amount of heat, can be cooled by a single cooling device.

(3) Examples of the heat generating devices further comprise an FD drive device and a CD/DVD drive device. Those drive devices can also be cooled by a single cooling device.

(4) Examples of the heat generating devices further comprise a LCD (liquid crystal display). In a computer integrated with an LCD, it is possible to cool the power source unit, the CPU, the disk drive device, and the LCD by a single cooling device.

(5) It is desirable that some of the heat generating devices are situated at right opposite a blowing port of the cooling device, the rest of the heat generating devices are situated in positions which are off the right opposite the blowing port, and no other devices interpose between the heat generating devices and the blowing port.

An airflow from the cooling device is generated by applying an axial pressure and a centrifugal force to the air through rotation of the impeller. Thus, the airflow from the cooling device is sent out over a range wider than the blowing port, so it can hit the heat generating devices situated so as not to be right opposite the blowing port of the cooling device.

(6) There can be provided as an example, the electronic apparatus, in which the power source unit and the CPU are situated at right opposite the blowing port of the cooling device, and the disk drive device and the LCD are situated in positions which are off the right opposite the blowing port.

(7) The present invention provides an electronic apparatus provided with a plurality of heat generating devices, wherein the electronic apparatus is provided with a cooling device for cooling the heat generating devices by drawing air from under the electronic apparatus; and exhaust air from the cooling device directly hits at least one specific heat generating device.

(8) The specific heat generating device is preferably a device requiring more heat discharge than the other heat generating devices.

(9) The present invention provides an electronic apparatus casing which is capable of containing a plurality of heat generating devices, wherein the electronic apparatus casing allows attachment of a cooling device for cooling the heat generating devices by drawing air from under the electronic apparatus; and exhaust air from the cooling device directly hits at least one specific heat generating device.

(10) The specific heat generating device is preferably a device requiring more heat discharge than the other heat generating devices.

According to the present invention, it is possible to cool a plurality of heat generating devices by a single cooling device, thereby making it possible to achieve a reduction in the number of parts, an improvement in cooling efficiency, and a reduction in size, and to suppress noise generation.

DETAILED DESCRIPTION OF THE INVENTION

In the following, an electronic apparatus according to an embodiment of the present invention will be described with reference to the drawings.

Figure 1:
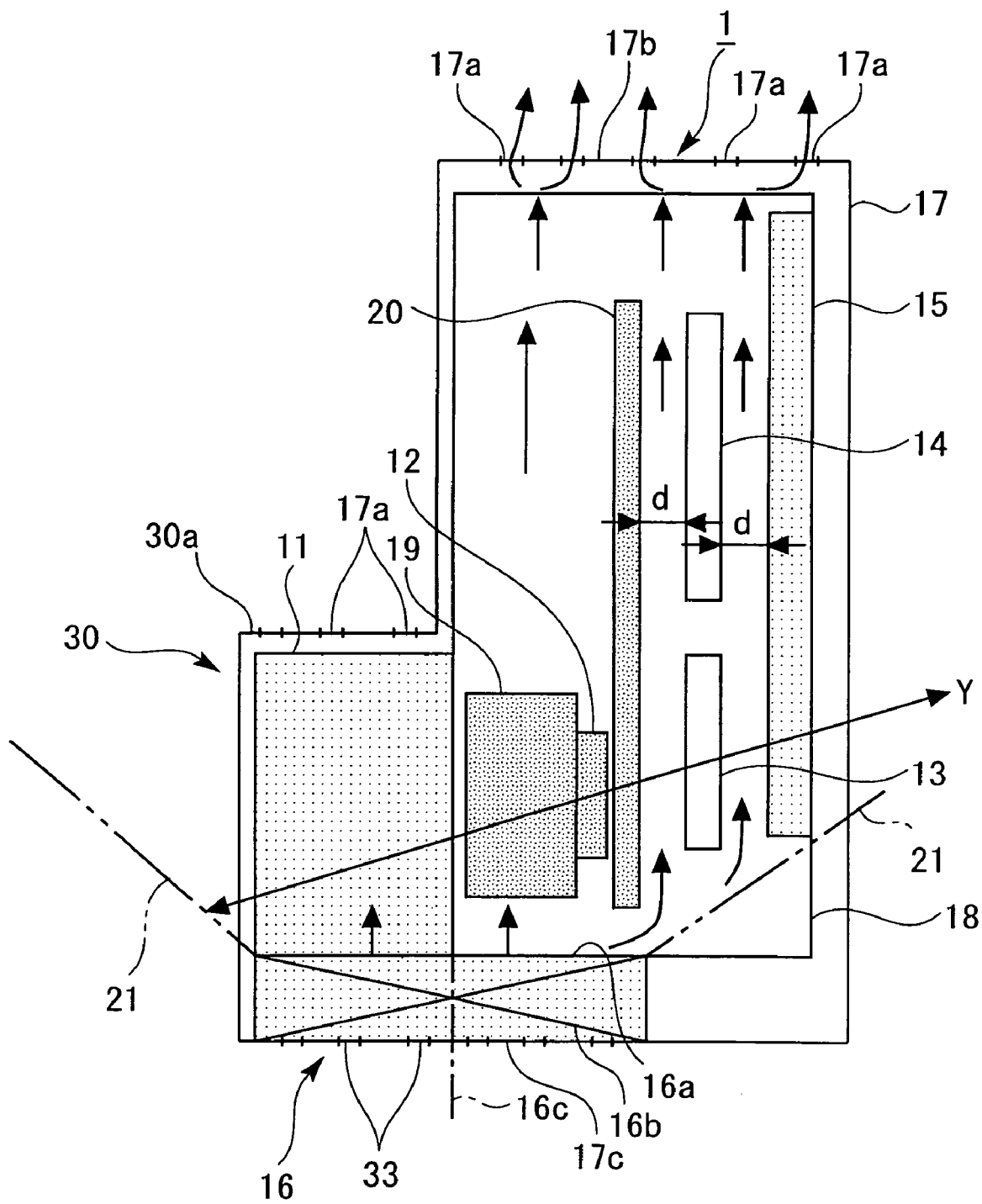
FIG. 1 is a sectional view of an electronic apparatus according to the present invention.

FIG. 1 shows a personal computer 1, which is an electronic apparatus according to this embodiment. The personal computer 1 is equipped with heat generating devices: a power source unit 11; a CPU 12; an FD (flexible disk) drive device 13; a CD (compact disc) /DVD (digital video disk) drive device 14; and an LCD (liquid crystal display) 15; and a cooling fan 16, which is a single cooling device for cooling the above heat generating devices.

In FIG. 1, reference numeral 17 indicates a casing, reference numeral 18 indicates a frame for mounting the above-mentioned heat generating devices 11 through 15, reference numeral 19 indicates a heat sink for cooling the CPU 12, and reference numeral 20 indicates a main substrate. The personal computer 1 is further equipped with general devices (not shown) other than those mentioned above.

The heat generating devices 11 through 15 are arranged in parallel in a direction Y crossing the central axis 16c of the impeller 16b of the cooling fan 16. Further, the heat generating devices 11 through 15 are arranged within the blowing range 21 of the cooling fan 16. In this embodiment, the heat generating devices are arranged in parallel substantially in the horizontal direction in the following order as from the left-hand side of FIG. 1: the power source unit 11; the CPU 12; the FD drive device 13 and the CD/DVD drive device 14; and the LCD 15.

The CD/DVD drive device 14 is provided behind the FD drive device 13 as seen from the cooling fan 16. On both sides of the CD/DVD drive device 14, there are provided predetermined gaps d,d. The airflow from the cooling fan 16 passes through these gaps d,d.

The cooling fan 16 is provided in the lower portion of the personal computer 1, and on the lower side in a direction crossing the direction Y in which the heat generating devices 11 through 15 are arranged. A blowing port 16a of the cooling fan 16 is directed upwards.

Further, in this embodiment, the power source unit 11 and the CPU 12 are situated so as to be right opposite the blowing port 16a of the cooling fan 16. The FD drive device 13, the CD/DVD drive device 14, and the LCD 15 are situated so as not to be right opposite the blowing port 16a of the cooling fan 16.

No other device exists between the blowing port 16a of the cooling fan 16 and the power source unit 11, the CPU 12, the FD drive device 13, and the LCD 14.

It should be noted that the FD drive device 13, the CD/DVD drive device 14, and the LCD 15 are arranged at positions where they receive the airflow from the cooling fan 16.

In other words, the above-mentioned plurality of heat generating devices 11 through 15 are arranged within the blowing range 21, which is obtained as follows: a blowing range 22 is formed by translating an opening range of the blowing port 16a, which is open in the direction of the central axis 16c of the impeller 16b of the cooling fan 16, in the direction of the central axis 16c; and then, the blowing range 22 thus formed is expanded in directions as determined by a wind pressure F1 in the direction of the central axis 16c and by a wind pressure F2 in an in-plane direction orthogonal to the central axis 16c.

Figure 2:
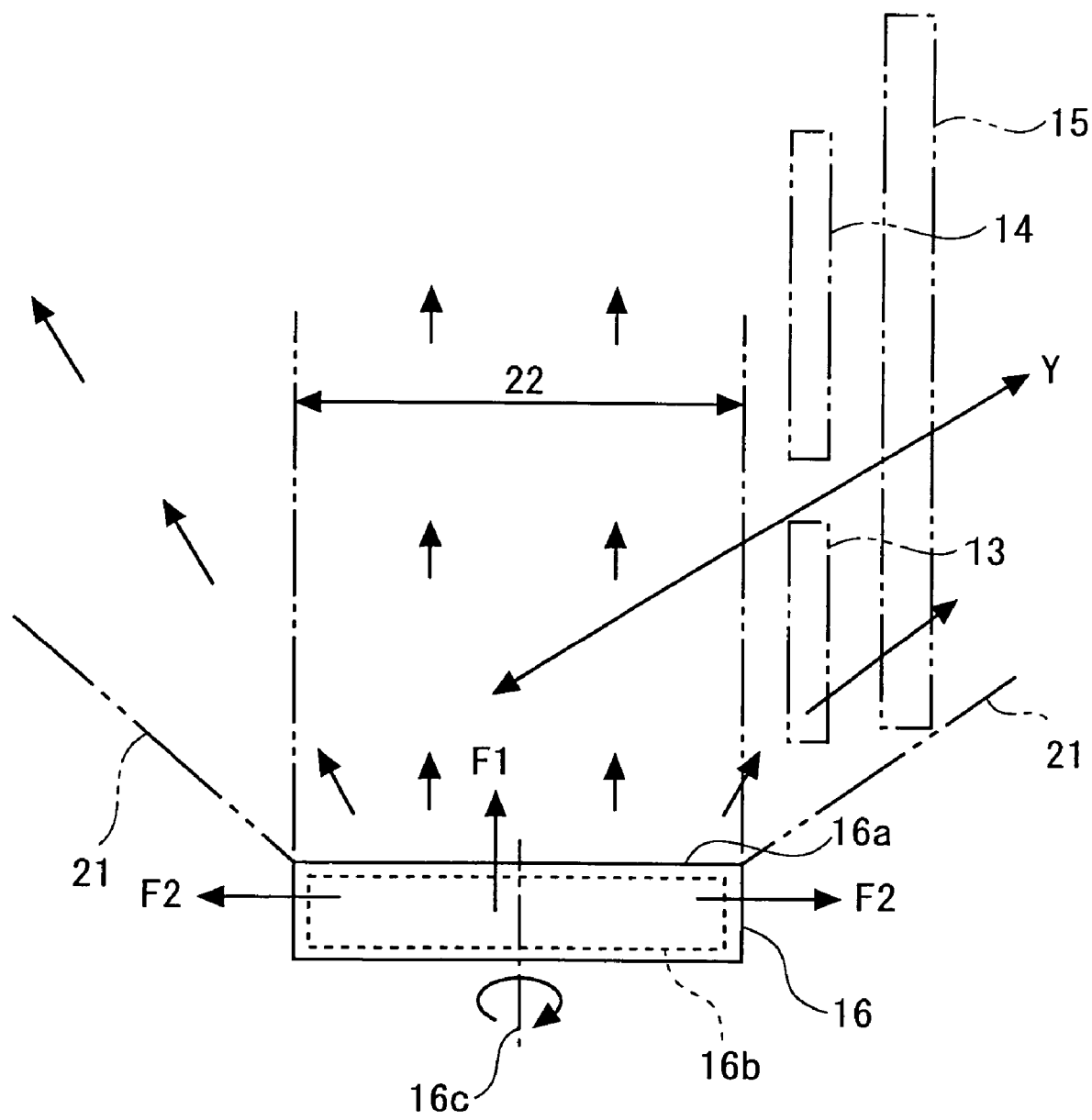
FIG. 2 is a diagram illustrating an operation of an electronic apparatus according to the present invention, and showing a blowing range of a cooling fan.

That is, as shown in FIG. 2, through the rotation of the impeller 16b, the cooling fan 16 applies the following pressures to the air around it: the pressure F1 in the direction of the central axis 16c, and the pressure (centrifugal force) F2 in the direction orthogonal to the central axis 16c. As a result, the air from the cooling fan 16 is sent over the range 21, which is larger than the area of the blowing port 16a.

The FD drive device 13, the CD/DVD drive device 14, and the LCD 15 are arranged at positions which are off the range 22 that is right opposite the blowing port 16a of the cooling fan 16 and at which they receive the airflow from the cooling fan 16, that is, within the above-mentioned blowing range 21.

In this embodiment, one half of the area of the blowing port 16a is right opposite the power source unit 11, and the other half thereof is right opposite the heat sink 19 and the CPU 12. This arrangement is adopted because the power source unit 11 and the CPU 12 generate a large amount of heat, and require a large amount of air for cooling them.

Figure 3:
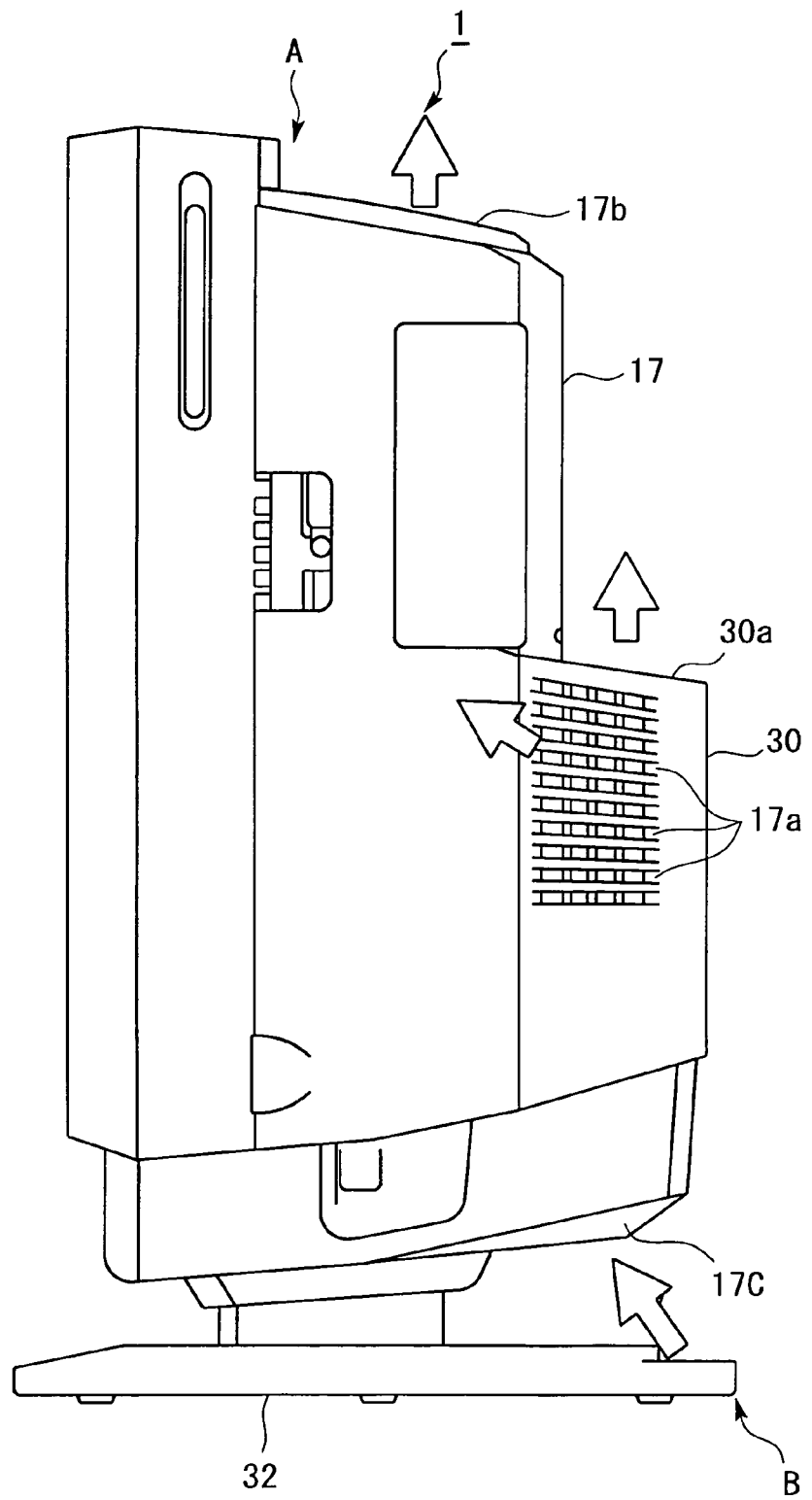
FIG. 3 is a side view of an electronic apparatus according to the present invention.

FIG. 3 is a side view of the personal computer 1. The casing 17 of the personal computer 1 has a protrusion 30 in substantially the lower half of the rear portion thereof. A large number of exhaust holes 17a are provided on either side of the protrusion 30. A stand 32 is provided under the casing 17.

Figure 4:
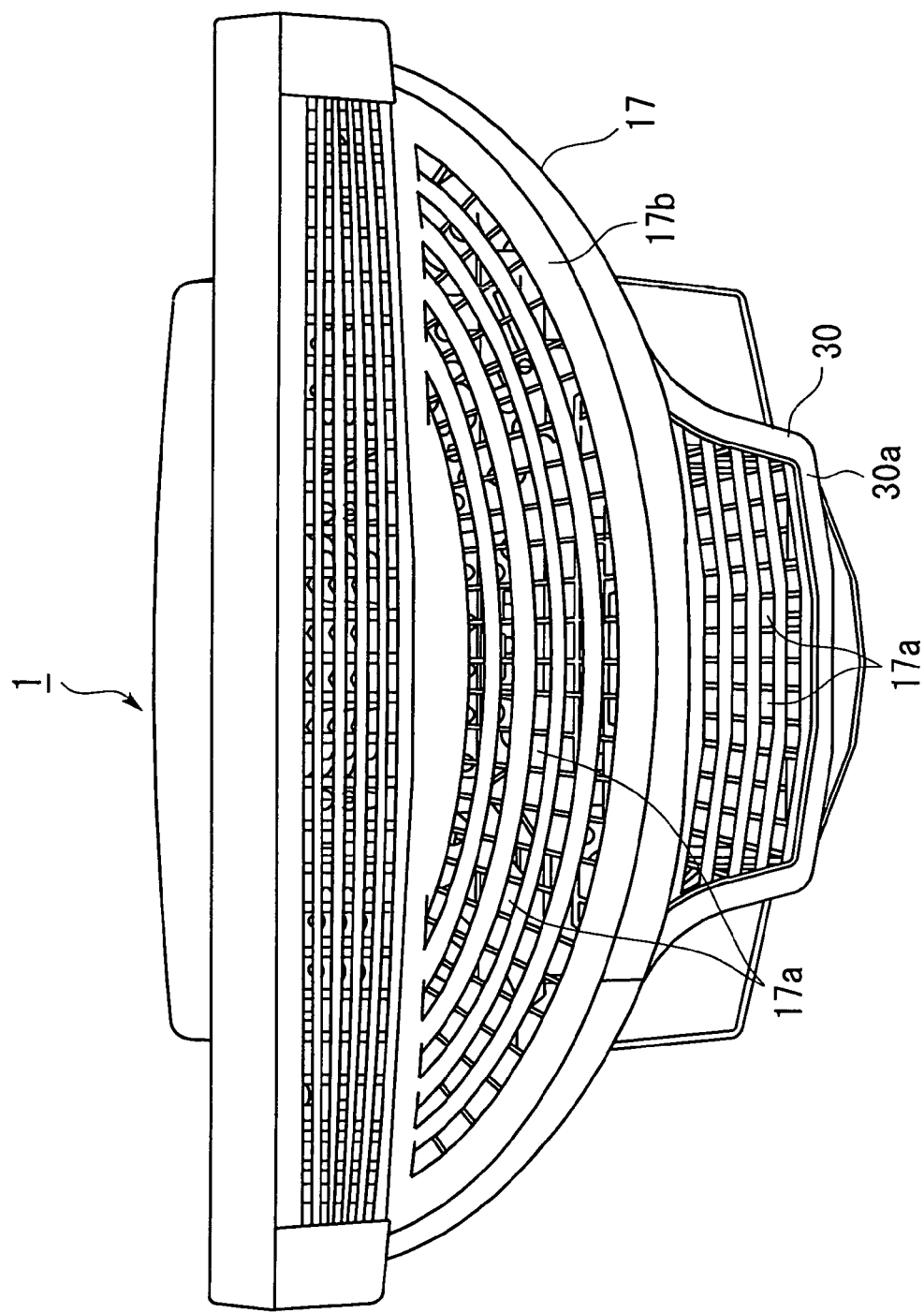
FIG. 4 is a top view, taken in a direction of an arrow A of FIG. 3, of an electronic apparatus according to the present invention.

Further, as shown in FIG. 4, a large number of exhaust holes 17a occupying a large area are provided in the upper surface 17b of the casing 17 and in the upper surface 30a of the protrusion 30.

Figure 5:
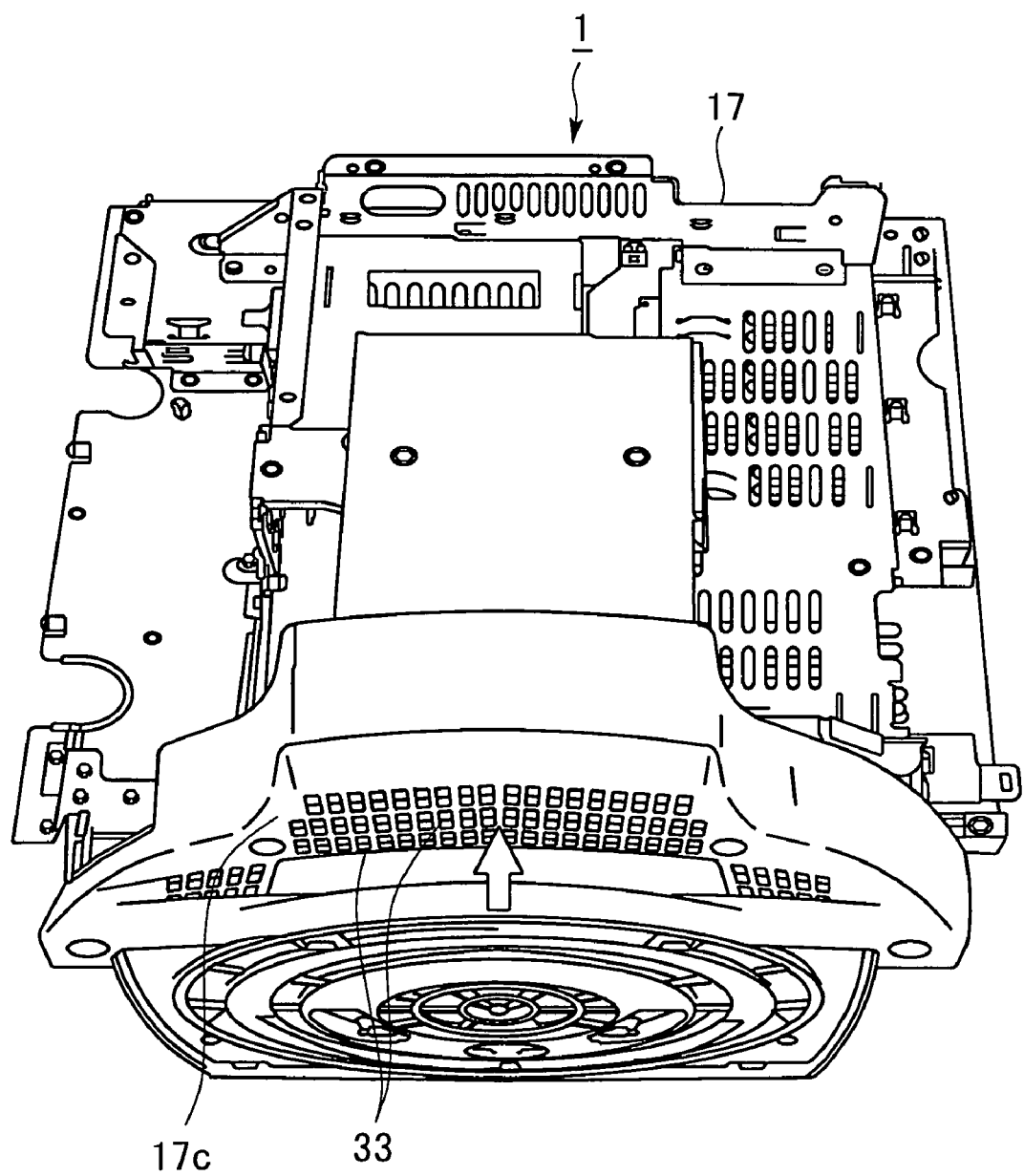
FIG. 5 is a bottom view, taken in a direction of an arrow B of FIG. 3, of an electronic apparatus according to the present invention.
Figure 6:
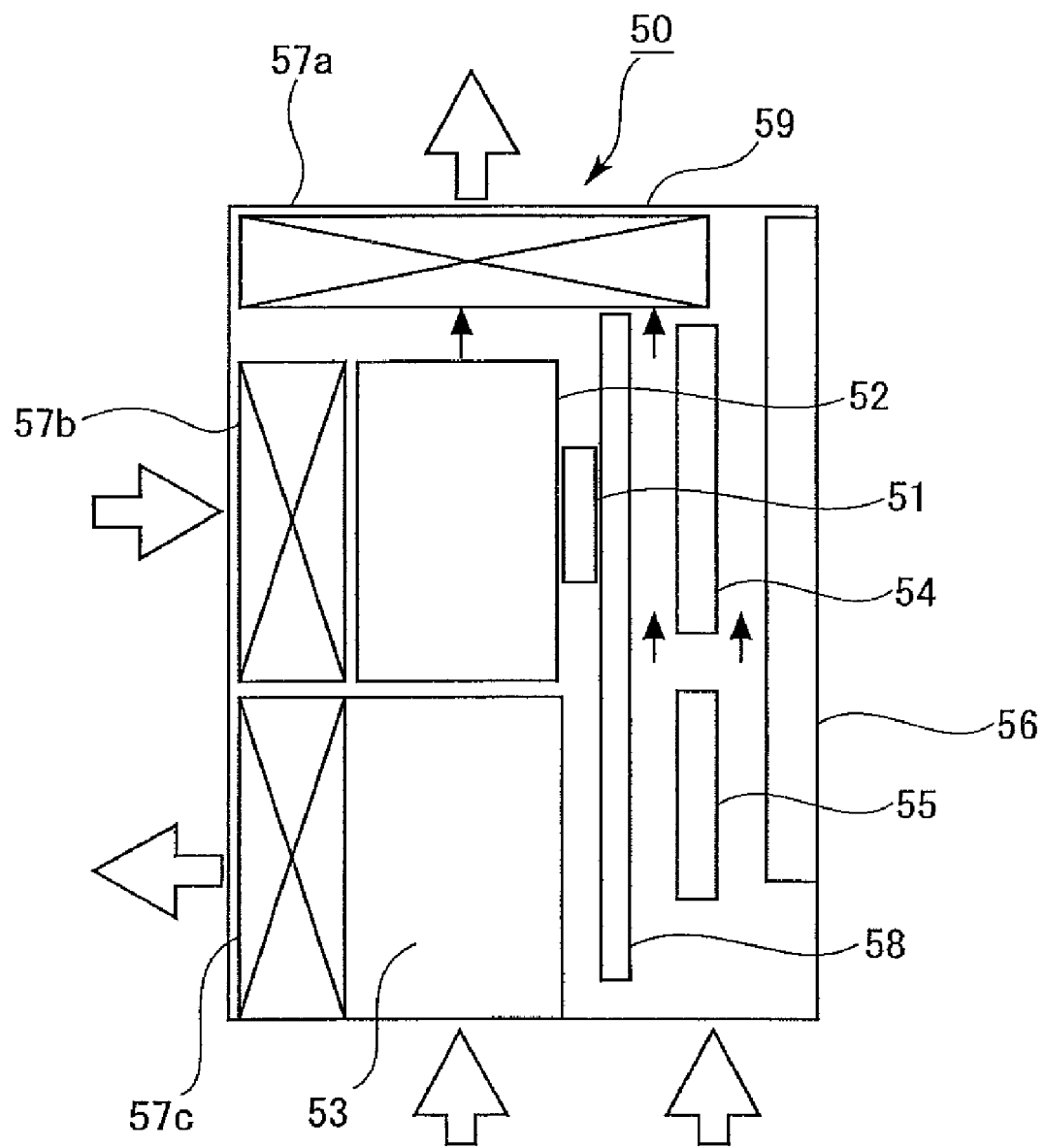
FIG. 6 is a sectional view of a conventional electronic apparatus.

Further, as shown in FIG. 5, a large number of intake holes 33 are provided over a wide range in the bottom surface 17c (the bottom surface of the protrusion 30) of the casing 17. Thus, air is taken in from under the personal computer 1.

The above-mentioned cooling fan 16 is attached to the casing 17. Further, a construction is adopted such that the exhaust air (airflow) from the cooling fan 16 directly hits at least one specific heat generating device of the above-mentioned heat generating devices.

Next, the cooling operation of the personal computer 1 will be described. The pressurized air (airflow or exhaust air) sent out from the blowing port 16a of the cooling fan 16 directly impacts against the power source unit 11, the HS 19, the CPU 12, the main substrate 20, the FD drive device 13, and the LCD 15, and at the same time, flows around them before being discharged through the upper and side exhaust holes 17a.

The airflow from the cooling fan 16 flows upwardly through the gaps d,d on both sides of the CD/DVD drive device 14. At this time, the CD/DVD drive device 14 is exposed to the airflow from the cooling fan 16. The air from the cooling fan 16 flows around the heat generating devices 11 through 15, and is then discharged through the large number of exhaust holes 17a provided in the upper surfaces 17b and 30a of the casing 17 and the protrusion 30, respectively, and in the side surfaces of the protrusion 30, never returning to the interior of the casing 17.

As a result, the power source unit 11, the CPU 12, the FD drive device 13, the CD/DVD drive device 14, and the LCD 15 are reliably cooled by the airflow from the cooling fan 16.

As described above, in this embodiment, the exhaust air (airflow) from the cooling fan 16 directly hits all the heat generating devices. It is possible to adopt a construction in which the exhaust air from the cooling fan 16 directly hits at least one specific heat generating device, for example, the CPU 12 and the power source unit 11, which require more heat discharge than the other heat generating devices.

In this way, in the personal computer 1 of the present invention, it is possible to cool all the heat generating devices, that is, the power source unit 11, the CPU 12, the FD drive device 13, the CD/DVD drive device 14, and the LCD 15, by the single cooling fan 16.

Thus, there is no need to use a plurality of cooling fans as in the prior art, so that it is possible to achieve a reduction in the number of parts, a reduction in assemblyman-hours, a reduction in cost, and a reduction in size. Further, as compared with the case in which plurality of cooling fans are used, it is possible to suppress noise generation.

Further, as compared with the case in which a plurality of cooling fans are used, the possibility of failure of the cooling fan is reduced, thus achieving an improvement in terms of reliability.

Further, the cooling fan 16 is arranged in the lower portion of the personal computer 1. Therefore, the distance between the cooling fan 16 and the ears of the operator of the personal computer 1 increases. Thus, it is possible to further suppress the noise of the cooling fan 16 as experienced by the operator.

Further, as described above, the cooling fan 16 is arranged in the lower portion of the personal computer 1, so the lower portion of the personal computer 1 protrudes farther than the other portion thereof. However, as compared with the case in which the upper portion of the personal computer 1 protrudes, the oppressive sensation as experienced by the operator can be mitigated.

Further, even when the size of the cooling fan 16 is increased, it is possible to mitigate the oppressive sensation as experienced by the operator by providing the cooling fan 16 in the lower portion of the personal computer 1.

Further, some heat generating devices, which, in this case, are the FD drive device 13, the CD/DVD drive device 14, and the LCD 15, are arranged at positions which are not right opposite the blowing port 16a of the cooling fan 16 and at which they receive the airflow from the cooling fan 16, so there is no need for the cooling fan 16 to be so large. Thus, it is possible to reduce the cost of the cooling fan 16.

As described above, in this embodiment, a large number of exhaust holes 17a are provided in the upper portion of the casing 17. It is desirable for the exhaust holes 17a to be provided at appropriate positions which allow the air from the cooling fan 16 to flow efficiently toward the heat generating devices 11 through 15 and which help to prevent the air discharged to the exterior of the casing 17 from entering the casing 17 through the exhaust holes 17a.

Further, at least one specific heat generating device of the above-mentioned heat generating devices, for example, the CPU 12, which requires more heat discharge than the other heat generating devices, may be directly exposed to the airflow from the cooling fan 16.

While in the above-described embodiment the present invention is applied to the personal computer 1, the present invention is also applicable to other various types of electronic apparatus in which a plurality of heat generating devices are to be cooled by a cooling fan, for example, a workstation (a computer of higher performance than a personal computer; it is put to commercial use by a person requiring a high performance computer, such as an engineer or a designer, or is used as a network server).

<Others>

The disclosures of Japanese patent application No. JP2005-294609 filed on Oct. 7, 2005 including the specification, drawings and abstract are incorporated herein by reference.

What is claimed is:

1. An electronic apparatus, comprising:
a plurality of heat generating devices including one or more of a power source unit, a CPU or a disk drive device; and
a cooling device cooling the plurality of heat generating devices by drawing air from under the electronic apparatus and directly hitting at least one of the heat generating devices with exhaust air from the cooling device,
wherein the plurality of heat generating devices are arranged within a blowing range of the cooling device and in parallel in a direction crossing a central axis of an impeller of the cooling device,
wherein
some of the heat generating devices are situated to be right opposite a blowing port of the cooling device,
a rest of the heat generating devices are situated in positions not to be right opposite the blowing port, and
no other devices interpose between the heat generating devices and the blowing port, and
wherein
the heat generating devices further include an LCD, and from among the heat generating devices the power source unit and the CPU are situated to be right opposite the blowing port of the cooling device, and the drive device and the LCD are situated in positions which are not right opposite the blowing port.

2. An electronic apparatus according to claim 1, wherein the heat generating devices are arranged substantially horizontally in parallel; and the cooling device is arranged on a lower side in a direction crossing the direction in which the heat generating devices are arranged.

3. An electronic apparatus according to claim 1, wherein the blowing range is formed by translating an opening range of the blowing port, which is open in a direction of the central axis of the impeller of the cooling device, in the direction of the central axis; and
the blowing range thus formed is expanded in directions as determined by a wind pressure in the direction of the central axis of the impeller of the cooling device and by a wind pressure in an in-plane direction orthogonal to the central axis.

4. An electronic apparatus according to claim 1, wherein a heat generating device from among the heat generating devices to which the exhaust air directly hits is a device requiring more heat discharge than the other heat generating devices.

* * * * *